(12) United States Patent
Bei

(10) Patent No.: US 10,615,048 B2
(45) Date of Patent: Apr. 7, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Duohui Bei, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/117,553

(22) Filed: Aug. 30, 2018

(65) Prior Publication Data

US 2019/0096692 A1 Mar. 28, 2019

(30) Foreign Application Priority Data

Sep. 22, 2017 (CN) .......................... 2017 1 0866497

(51) Int. Cl.
*H01L 21/027* (2006.01)
*H01L 21/311* (2006.01)
*H01L 21/02* (2006.01)
*H01L 21/033* (2006.01)
(Continued)

(52) U.S. Cl.
CPC .... *H01L 21/31144* (2013.01); *H01L 21/0214* (2013.01); *H01L 21/0217* (2013.01);
(Continued)

(58) Field of Classification Search
CPC ......... H01L 21/31144; H01L 21/02118; H01L 21/2885; H01L 21/76877; H01L 21/0214;
(Continued)

(56) References Cited

U.S. PATENT DOCUMENTS

| 7,112,527 B2 * | 9/2006 | Awaya | H01L 21/76838 |
| | | | 257/E21.582 |
| 2003/0064577 A1 * | 4/2003 | Hsu | H01L 21/76811 |
| | | | 438/619 |

(Continued)

OTHER PUBLICATIONS

Abercrombie, David, "Self-Aligned Double Patterning, Part One", Semiconductor Engineering, Manufacturing & Process Technology, May 15, 2014, http://semiengineering.com/self-aligned-double-patterning-part-one, 1-15 pages.

(Continued)

*Primary Examiner* — Hoa B Trinh
(74) *Attorney, Agent, or Firm* — Anova Law Group, PLLC

(57) ABSTRACT

A semiconductor structure and a method for fabricating the semiconductor structure are provided. The method includes providing a substrate including a device region, and forming a functional layer on the substrate. The method also includes forming a plurality of discrete initial core layers on the functional layer. Adjacent initial core layers are spaced apart by a first gap. In addition, the method includes forming a sidewall spacer on a sidewall surface of an initial core layer, and forming a first opening in the functional layer by removing the functional layer at a bottom of the first gap. Moreover, the method includes forming a core layer and a second gap between sidewall spacers by performing a patterning process to remove a portion of the initial core layer. Further, the method includes forming a second opening by removing the functional layer exposed at a bottom of the second gap.

18 Claims, 11 Drawing Sheets

(51) Int. Cl.
- *H01L 21/3105* (2006.01)
- *H01L 21/768* (2006.01)
- *H01L 23/532* (2006.01)
- *H01L 21/288* (2006.01)

(52) U.S. Cl.
CPC .. *H01L 21/02118* (2013.01); *H01L 21/02164* (2013.01); *H01L 21/0332* (2013.01); *H01L 21/0337* (2013.01); *H01L 21/31051* (2013.01); *H01L 21/31116* (2013.01); *H01L 21/31138* (2013.01); *H01L 21/76802* (2013.01); *H01L 21/76816* (2013.01); *H01L 21/76877* (2013.01); *H01L 23/53228* (2013.01); *H01L 21/2885* (2013.01); *H01L 21/7684* (2013.01)

(58) Field of Classification Search
CPC ............. H01L 21/0332; H01L 21/0337; H01L 21/31051; H01L 21/31116; H01L 21/31138; H01L 21/76873; H01L 21/288
See application file for complete search history.

(56) References Cited

U.S. PATENT DOCUMENTS

| | | | |
|---|---|---|---|
| 2018/0240667 A1* | 8/2018 | Yu | H01L 21/465 |
| 2018/0247938 A1* | 8/2018 | Cheng | H01L 27/0924 |
| 2018/0330986 A1* | 11/2018 | Briggs | H01L 21/0337 |

OTHER PUBLICATIONS

Abercrombie, David, "Self-Aligned Double Patterning, Part deux", Semiconductor Engineering, Manufacturing & Process Technology, Aug. 14, 2014, http://semiengineering.com/self-aligned-double-patterning-part-deux, 1-17 pages.

Abercrombie, David, "Case Studies in P&R Double-Patterning Debug", Semiconductor Engineering, Manufacturing & Process Technology, Aug. 20, 2015, http://semiengineering.com/case-studies-in-pr-double-patterning-debug, 1-18 pages.

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710866497.9, filed on Sep. 22, 2017, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

With the rapid development of semiconductor manufacturing technology, the semiconductor device has been developed toward higher component density and higher integration degree. To reduce the size of the semiconductor device and to improve the integration degree of the semiconductor device, a multiple patterning process, e.g., a double patterning process, a triple patterning process, and a quadruple patterning process, has been developed.

The double patterning process can effectively reduce the difficulty of fabricating a small-sized pattern and has important applications in forming the small-sized pattern. The double patterning process includes a self-aligned double patterning (SADP) technique, a litho-etch-litho-etch-litho-etch (LELELE) technique, and a single-etch double patterning technique.

However, the semiconductor structure formed by the double patterning process has poor performance or has many restrictions on the design. For example, in the litho-etch-litho-etch-litho-etch (LELELE) technique, the alignment of multiple patterns is very difficult to control. In the self-aligned double patterning (SADP) technique, a spacing between two patterns or a pattern itself is determined by a thickness of a spacer wall. With single pattern linewidth or single spacing, the scope of the applications of the self-aligned double patterning (SADP) technique is limited. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate including a device region, and forming a functional layer on the substrate. The method also includes forming a plurality of discrete initial core layers on the functional layer. Adjacent initial core layers are spaced apart by a first gap. In addition, the method includes forming a sidewall spacer on a sidewall surface of an initial core layer, and forming a first opening in the functional layer by removing the functional layer at a bottom of the first gap. Moreover, the method includes forming a core layer and a second gap between sidewall spacers by performing a patterning process on the initial core layer to remove a portion of the initial core layer. Further, the method includes forming a second opening in the functional layer by removing the functional layer exposed at a bottom of the second gap.

Another aspect of the present disclosure includes a semiconductor structure. The semiconductor structure includes a substrate including a device region, and a functional layer on the substrate. The semiconductor structure also includes a plurality of discrete sidewall spacers, on the functional layer in the device region. Adjacent sidewall spacers are spaced apart by a first gap and a second gap, and the first gap and the second gap are alternately arranged. In addition, the semiconductor structure includes a core layer on a sidewall surface of one side of the sidewall spacer. The core layer is disposed in the second gap. Moreover, the semiconductor structure includes a second opening in the functional layer at a bottom of the second gap exposed by the sidewall spacer and the core layer. Further, the method includes a first opening in the functional layer at a bottom of the first gap.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
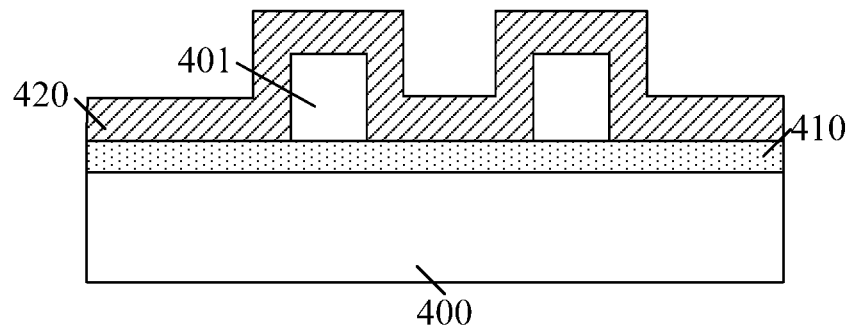
FIGS. 1-3 illustrate structures corresponding to certain stages for forming a semiconductor structure.
Figure 2:
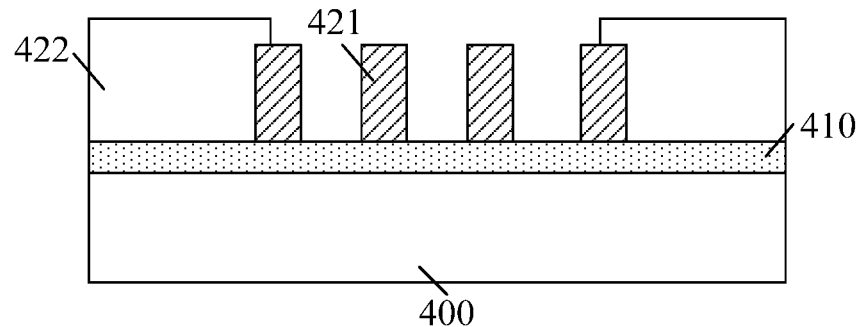
Figure 3:
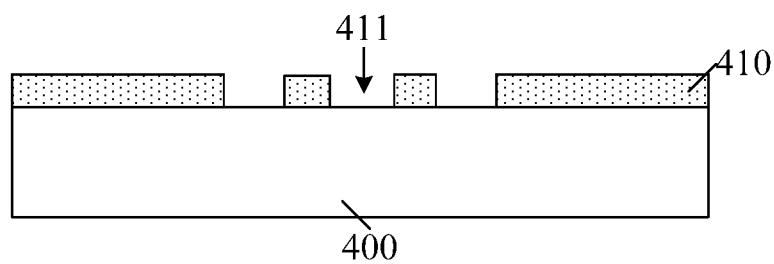

FIGS. 1-3 illustrate structures corresponding to certain stages for forming a semiconductor structure. Referring to FIG. 1, a substrate 400 is provided, and an isolation layer 410 is formed on the substrate 400. A plurality of discrete core layers 401 are formed on the isolation layer 410, and a sidewall spacer layer 420 is formed on the isolation layer 410 and a sidewall and top surface of the core layer 401.

Referring to FIG. 2, a plurality of sidewall spacers 421 are formed by removing the sidewall spacer layer 420 on the isolation layer 410 and on the top of the core layer 401. After forming the sidewall spacer 421, the core layer 401 (illustrated in FIG. 1) is removed. After removing the core layer 401, a patterned layer 422 is formed on the isolation layer 410, and the patterned layer 422 exposes the isolation layer 410 between the sidewall spacers 421.

Referring to FIG. 3, an opening 411 is formed in the isolation layer 410 by etching the isolation layer 410 using the sidewall spacer 421 (illustrated in FIG. 2) and the patterned layer 422 (illustrated in FIG. 2) as a mask. After forming the opening 411, the sidewall spacer 421 and the patterned layer 422 are removed. Interconnection line is subsequently formed in the opening 411.

Forming the sidewall spacer layer 420 includes a chemical vapor deposition process. A thickness of the sidewall spacer layer 420 is uniform, and, thus, the formed sidewall spacers 421 have a same thickness. When etching the isolation layer 410, the isolation layer 410 between adjacent sidewall spacers 421 is removed to form the opening 411. Therefore, a spacing between adjacent openings 411 is equal to the thickness of the sidewall spacer 421. Because the sidewall spacers 421 have the same thickness, the spacing between the adjacent openings 411 is the same. Accordingly, in the formed semiconductor structure, the spacing between the adjacent openings 411 is identical. It is impossible to use such fabrication method to form semiconductor structures having different spacings between the adjacent openings 411. The formed semiconductor structure may not meet design requirements, and the performance of the semiconductor structure is poor.

The present disclosure provides a semiconductor structure and fabrication method thereof. The method includes after forming a sidewall spacer, forming a first opening in a functional layer by removing the functional layer at a bottom of a first gap, and forming a core layer and a second gap by patterning an initial core layer to remove a portion of the initial core layer; and forming a second opening in the functional layer by removing the exposed functional layer at a bottom of the second gap. Therefore, the flexibility of the spacing between the second opening and the first opening may increase, and the performance of the formed semiconductor structure may be further improved.

Figure 28:
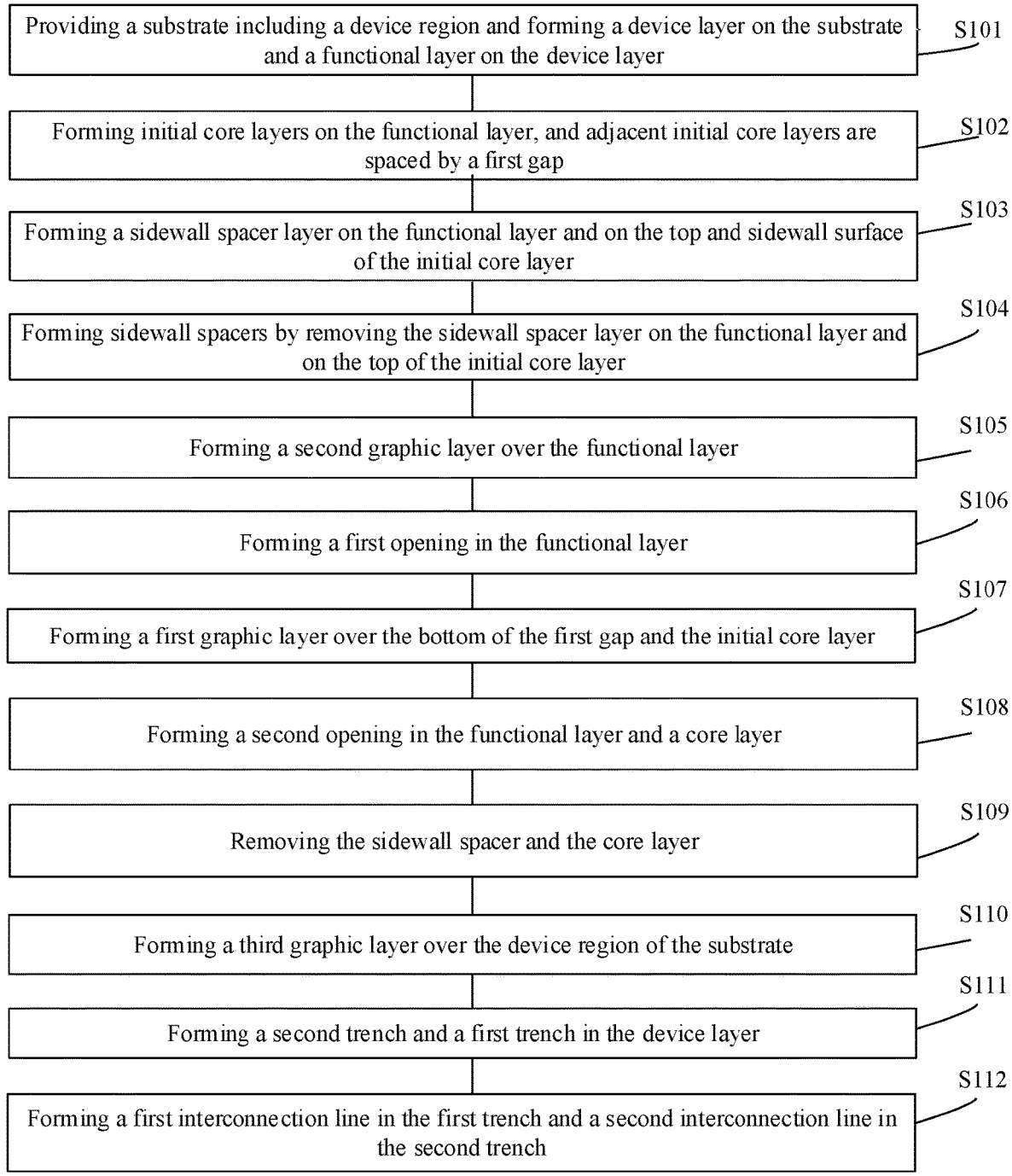
FIG. 28 illustrates an exemplary fabrication method for forming a semiconductor structure consistent with various disclosed embodiments of the present disclosure.

FIG. 28 illustrates an exemplary fabrication method for forming a semiconductor structure consistent with various disclosed embodiments of the present disclosure; and FIGS. 4-19 illustrate structures corresponding to certain stages of the exemplary fabrication method.

Figure 4:
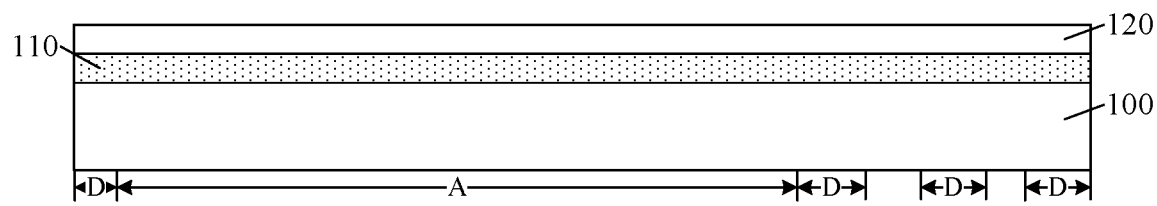
FIGS. 4-19 illustrate structures corresponding to certain stages for forming an exemplary semiconductor structure consistent with various disclosed embodiments of the present disclosure.

As shown in FIG. 28, at the beginning of the fabrication method, a substrate with certain structures may be provided (S101). FIG. 4 illustrates a corresponding structure.

Referring to FIG. 4, a substrate 100 may be provided. The substrate 100 may include a device region A. The device region A may be used to subsequently form a core layer, a second interconnection line, and a first interconnection line.

In one embodiment, the substrate 100 may include a preserved region D. In another embodiment, the substrate may not include the preserved region. In one embodiment, the number of the preserved regions D may be more than one. In another embodiment, the number of the preserved regions may be one.

In one embodiment, the substrate 100 may include a substrate and fins on the substrate. In another embodiment, the substrate may be a planar substrate, such as a silicon substrate, a germanium substrate, a silicon germanium substrate, a silicon on insulator substrate, or a germanium on insulator substrate, etc.

In one embodiment, both the substrate and the fin may be made of silicon. In another embodiment, both the substrate and the fin may be made of germanium, or silicon germanium, etc.

In one embodiment, the substrate 100 may include a semiconductor device. Referring to FIG. 4, a functional layer 120 may be formed over the substrate 100. In one embodiment, before forming the functional layer 120, a device layer 110 may be formed on the substrate 100, and the functional layer 120 may be formed on the device layer 110. The device layer 110 may be made of a material different from the functional layer 120. In another embodiment, the device layer may not be formed.

In one embodiment, the functional layer 120 may be used to subsequently form a mask for etching the device layer 110. In another embodiment, the device layer may not be formed. The functional layer may be used to electrically isolate the interconnection lines, or the functional layer may be used to form a dummy gate structure, or a gate structure, etc.

In one embodiment, the device layer 110 may be used to electrically isolate the interconnection lines. In another embodiment, the device layer may be used to form a gate structure, or a dummy gate structure, etc.

In one embodiment, the device layer 110 may be used to electrically isolate subsequently formed interconnection lines. The device layer 110 may be made of an insulating material, such as silicon oxide, silicon nitride, silicon oxynitride, or an organic dielectric material. The organic dielectric material may include polyimide. In one embodiment, the device layer 110 may be made of silicon oxide. Silicon oxide may have a desired interface state with substrate 100.

In another embodiment, the device layer may be used to realize interconnection between device structures, and the device layer may be made of aluminum. In certain embodiments, the device layer may be used to form a dummy gate structure, or a gate structure, etc., and the device layer may be made of polysilicon, polycrystalline germanium, or polycrystalline silicon germanium, etc.

In one embodiment, the functional layer 120 may be made of silicon nitride, or silicon oxynitride, etc. In another embodiment, the functional layer may be made of silicon oxide, or an organic dielectric material, etc. The organic dielectric material may include polyimide.

A plurality of discrete initial core layers may be subsequently formed on the functional layer 120 in the device region A, and adjacent initial core layers may be spaced apart by a first gap.

Figure 5:
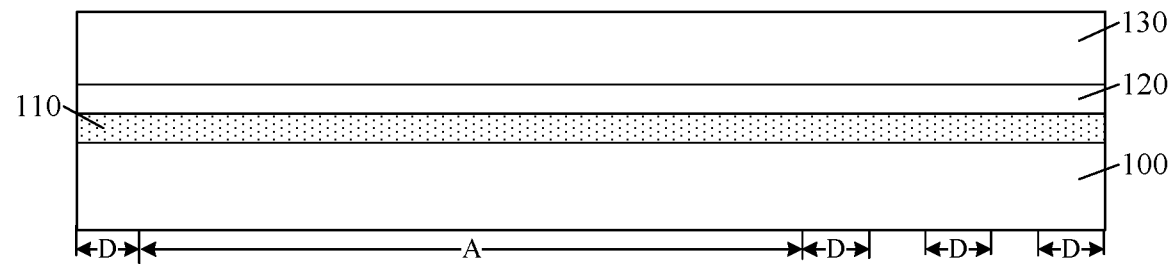
Figure 6:
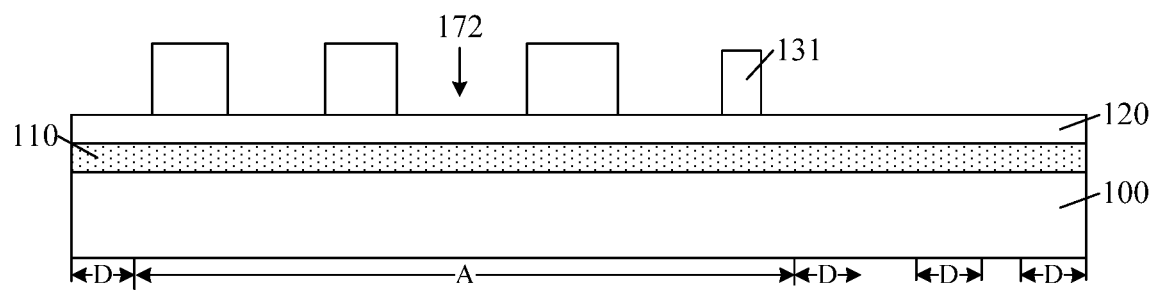

Returning to FIG. 28, after forming the substrate, initial core layers may be formed (S102). FIGS. 5-6 illustrate corresponding structures.

Referring to FIG. 5, an initial core film 130 may be formed on the functional layer 120. The initial core film 130 may be made of a material different from the functional layer 120. The initial core film 130 may be used to subsequently form initial core layers.

The initial core film 130 may be made of amorphous carbon, amorphous silicon, amorphous germanium, or amorphous silicon germanium, etc. Forming the initial core film 130 may include a chemical vapor deposition process, or a physical vapor deposition process, etc.

Referring to FIG. 6, initial core layers 131 may be formed on the functional layer 120 in the device region A by performing an initial patterning process on the initial core film 130 (illustrated in FIG. 5). Adjacent initial core layers 131 may be spaced apart by a first gap 172. The initial core layers 131 may be used to subsequently form core layers. In one embodiment, the number of the initial core layers 131 may be more than one, and the plurality of initial core layers 131 may be discrete.

Forming the initial core layers 131 may include: forming a patterned photoresist on the initial core film 130; and etching the initial core film 130 using the patterned photoresist as a mask to form the initial core layers 131.

Widths of the plurality of initial core layers 131 may be the same, or different. The width of the initial core layer 131 may be determined by a width of a second opening to be subsequently formed, a width of a sidewall spacer to be subsequently formed, and a spacing between the second opening and a first opening to be subsequently formed. In one embodiment, the width of the second opening to be subsequently formed may be a first width $d_1$, the width of the sidewall spacer may be a second width $d_2$, and the spacing between the second opening and adjacent two first openings may be a first spacing $H_1$ and a second spacing $H_2$, respectively. The width of the initial core layer 131 may be d, and, then $d=d_1+H_1+H_2-2d_2$.

In one embodiment, the widths of the plurality of initial core layers 131 may be different. In another embodiment, the widths of the plurality of initial core layers may be the same. A sidewall spacer may be subsequently formed on a sidewall surface of the initial core layer 131.

Figure 7:
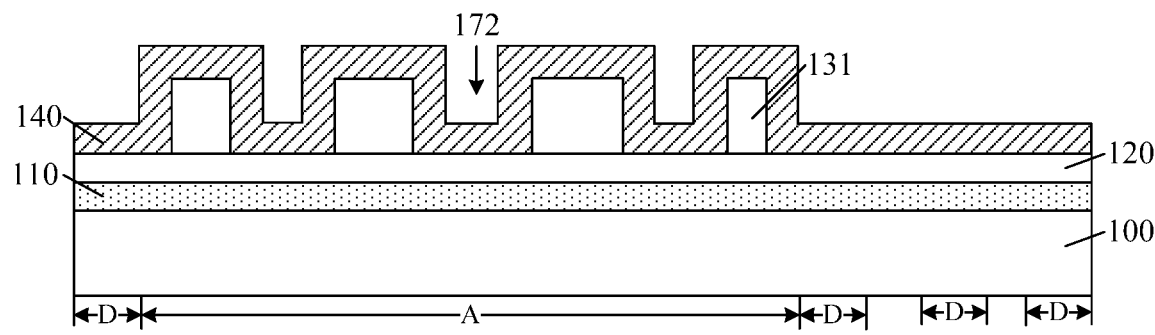

Returning to FIG. 28, after forming the initial core layers, a sidewall spacer layer may be formed (S103). FIG. 7 illustrates a corresponding structure.

Referring to FIG. 7, a sidewall spacer layer 140 may be formed on the functional layer 120, and on the top and the sidewall surface of the initial core layer 131. The sidewall spacer layer 140 may be used to subsequently form sidewall spacers.

The sidewall spacer layer 140 may be made of a material different from the initial core layer 131, and the sidewall spacer layer 140 may be made of a material different from the functional layer 120.

The sidewall spacer layer 140 may be made of the material different from the initial core layer 131, such that the subsequently formed sidewall spacer may not be easily removed during the subsequent formation of the core layer by etching the initial core layer. The sidewall spacer layer 140 may be made of the material different from the functional layer 120, such that the subsequently formed sidewall spacer may be used as a mask for etching the functional layer 120. In one embodiment, the sidewall spacer layer 140 may be made of silicon nitride. In another embodiment, the functional layer may be made of silicon oxide.

In one embodiment, forming the sidewall spacer layer 140 may include a chemical vapor deposition process. In another embodiment, forming the sidewall spacer layer may include a physical vapor deposition process, or an atomic layer deposition process, etc.

If a thickness of the sidewall spacer layer 140 is too large or too small, the spacing between the subsequently formed second opening and first opening may be too large or too small, thereby affecting the performance of the formed semiconductor structure. In one embodiment, the thickness of the sidewall spacer layer 140 may be in a range of approximately 18 nm-22 nm.

Figure 8:
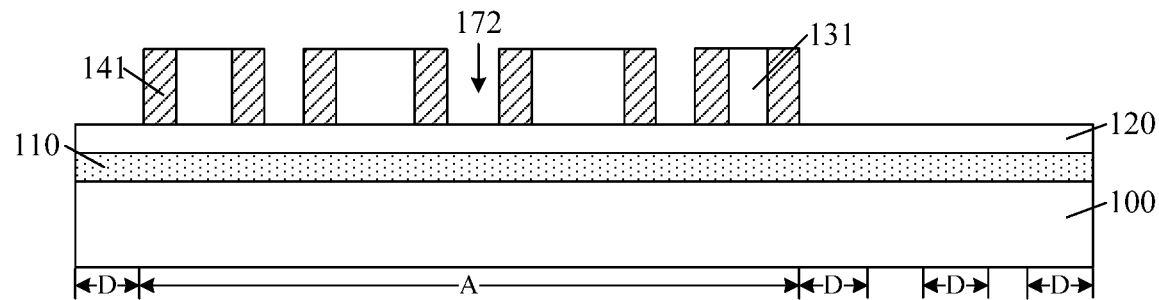

Returning to FIG. 28, after forming the sidewall spacer layer, sidewall spacers may be formed (S104). FIG. 8 illustrates a corresponding structure.

Referring to FIG. 8, sidewall spacers 141 may be formed by removing the sidewall spacer layer 140 on the functional layer 120 and on the top of the initial core layer 131. The sidewall spacer 141 may be used as a mask for subsequently etching the functional layer 120 to prevent the functional layer 120 under the sidewall spacer 141 from being removed.

Removing the sidewall spacer layer 140 on the functional layer 120 and on the top of the initial core layer 131 may include an anisotropic dry etching process. The anisotropic dry etching process may have a smaller lateral etching rate compared to a vertical etching rate, and may be capable of removing the sidewall spacer layer 140 on the functional layer 120 and on the top of the initial core layer 131. The anisotropic dry etching process may have a desired linewidth control and may precisely control a width of the sidewall spacer 141, thereby increasing the accuracy of the spacing between the subsequently formed second opening and first opening.

In one embodiment, the width of the sidewall spacer 141 may be equal to the thickness of the sidewall spacer layer 140. In one embodiment, the width of the sidewall spacer 141 may be in a range of approximately 18 nm-22 nm.

After forming the sidewall spacer 141, the functional layer 120 at the bottom of the first gap 172 exposed by the sidewall spacer 141 may be removed to form a first opening in the functional layer 120.

Figure 9:
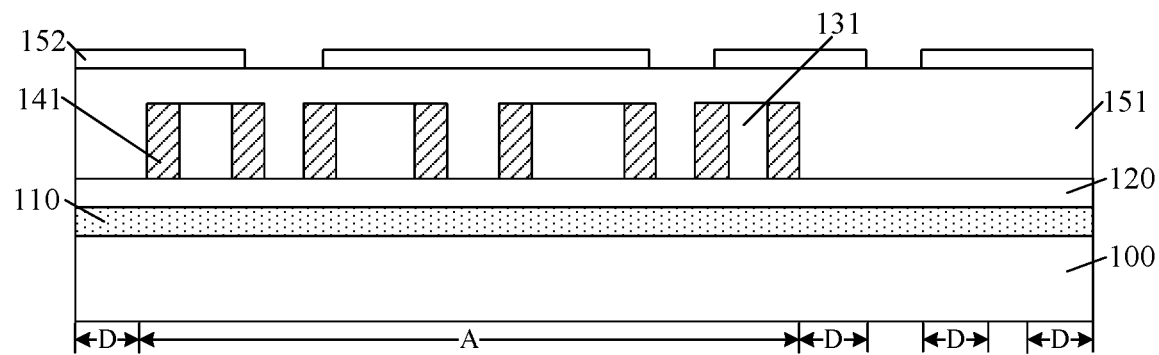

Returning to FIG. 28, after forming the sidewall spacer, a second graphic layer may be formed (S105). FIG. 9 illustrates a corresponding structure.

Referring to FIG. 9, a patterned second graphic layer 152 may be formed over the functional layer 120. The second graphic layer 152 may cover the functional layer 120 in the preserved region D. The second graphic layer 152 may be used as a mask for subsequently etching the functional layer 120, and may protect the functional layer 120 in the preserved region D. The second graphic layer 152 may be made of a photoresist.

In one embodiment, the number of the first gaps 172 may be more than one, and the second graphic layer 152 may partially cover the functional layer at the bottom of the first gap 172. In another embodiment, the second graphic layer may not cover the functional layer at the bottom of the first gap.

In one embodiment, before forming the second graphic layer 152, a second planarization layer 151 may be formed on the sidewall spacer 141, the initial core layer 131, and the functional layer 120. The second graphic layer 152 may be formed on the second planarization layer 151. In another embodiment, the second planarization layer may not be formed.

The second planarization layer 151 may be used to flatten a bottom of the second graphic layer 152, such that reflection and scattering of light may be reduced during the formation of the second graphic layer 152, and size and position of the second graphic layer 152 may be precisely controlled.

Forming the second planarization layer 151 may include forming a second initial planarization layer on the sidewall spacer 141, the initial core layer 131, and the functional layer 120; and performing a second planarization process on the second initial planarization layer to form the second planarization layer 151.

The second initial planarization layer may be made of an organic dielectric material. Forming the second initial planarization layer may include a spin coating process. The second planarization process may include a chemical mechanical polishing process.

In certain embodiments, the substrate may not include the preserved region, and, thus, the second graphic layer may not be formed.

Figure 10:
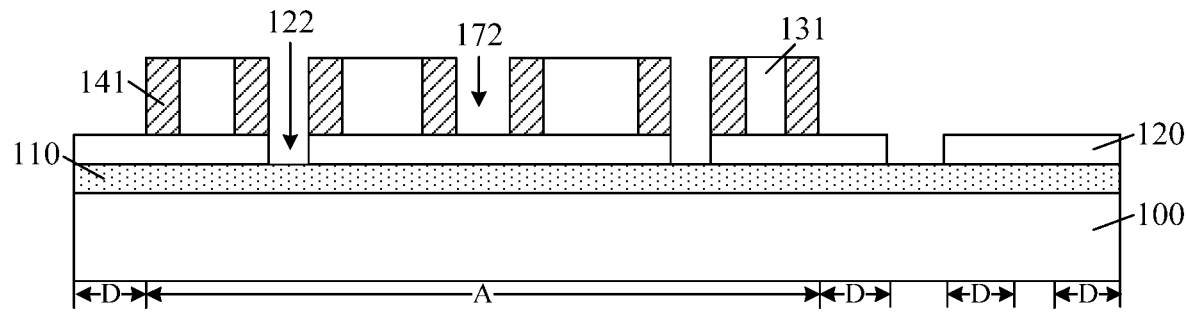
Figure 11:
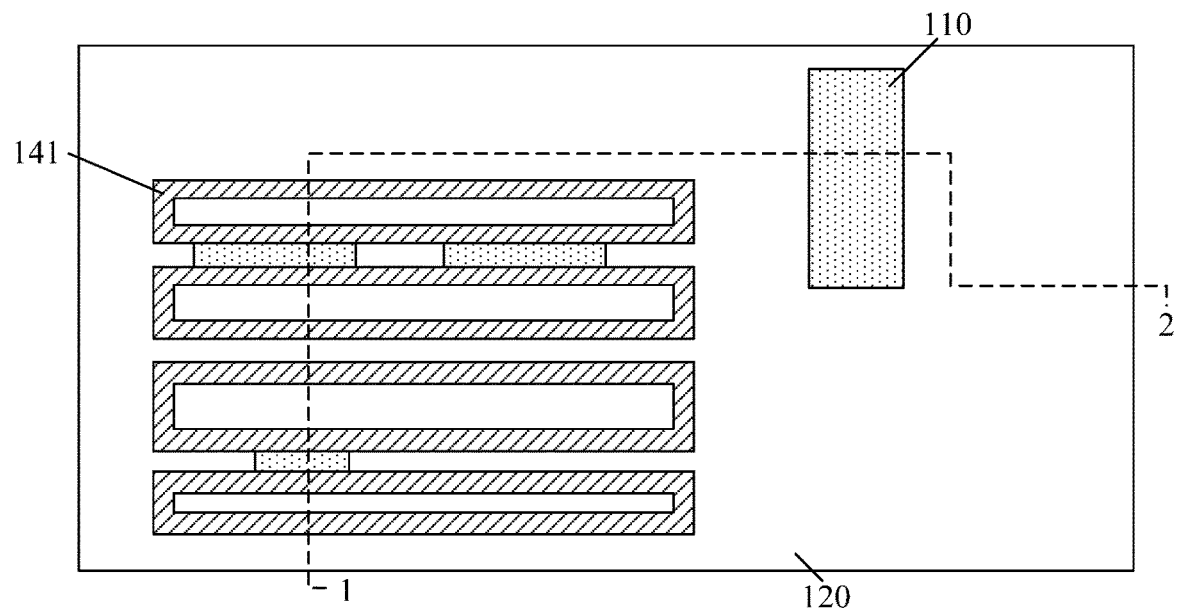

Returning to FIG. 28, after forming the second graphic layer, a first opening may be formed (S106). FIGS. 10-11 illustrate corresponding structures. FIG. 11 illustrates a top view of the structure shown in FIG. 10, and FIG. 10 illustrates a cross-sectional view of the structure along a line '1-2' in FIG. 11.

Referring to FIGS. 10-11, a first opening 122 may be formed in the functional layer 120 by performing a first etching process on the functional layer 120 using the sidewall spacer 141, the initial core layer 131, and the second graphic layer 152 (illustrated in FIG. 9) as a mask. In one embodiment, the first opening 122 may be used to subsequently form a first trench. In another embodiment, the functional layer may be used to form a gate structure, or a dummy gate structure, and the first opening may electrically isolate the gate structures, or the dummy gate structures.

In one embodiment, the first etching process may include a dry etching process. The dry etching process may have a desired linewidth control and may easily control a width of the first opening 122, such that a width of a subsequently formed first interconnection line may be precisely controlled.

The width of the first opening 122 may be equal to the width of the first gap 172, and, thus, the width of the first interconnection line subsequently formed in a first trench may be equal to the width of the first gap 172.

After forming the first opening 122, the second graphic layer 152 and the second planarization layer 151 (illustrated in FIG. 9) may be removed. Removing the second planarization layer 151 may include a dry etching process, or a wet etching process, etc. Removing the second graphic layer 152 may include an ashing process.

A core layer and a second gap between adjacent sidewall spacers 141 may be subsequently formed by performing a patterning process on the initial core layer 131 to remove a portion of the initial core layer 131. After forming the core layer and the second gap, a second opening may be formed by removing the functional layer 120 at a bottom of the second gap exposed by the core layer and the sidewall spacer 141.

Figure 12:
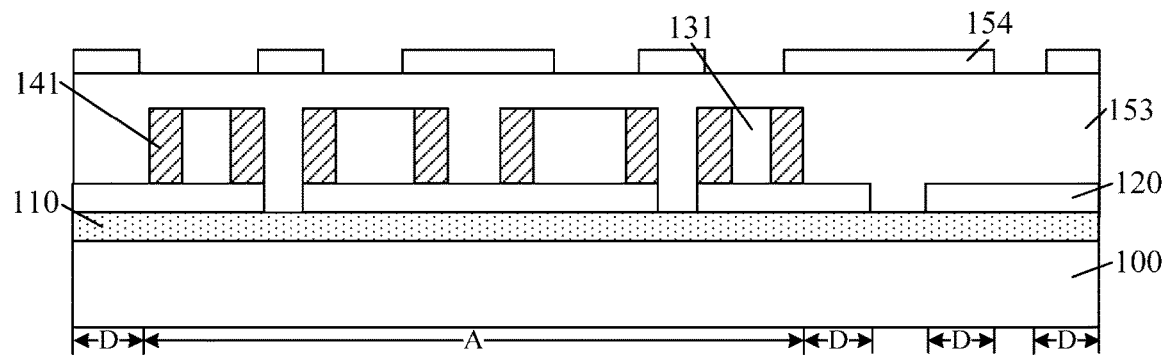

Returning to FIG. 28, after forming the first opening, a first graphic layer may be formed (S107). FIG. 12 illustrates a corresponding structure.

Referring to FIG. 12, a patterned first graphic layer 154 may be formed over the bottom of the first gap 172 and the initial core layer 131. The first graphic layer 154 may expose a portion of the initial core layer 131. The first graphic layer 154 may be used as a mask of a subsequent second etching process, and may protect the bottom of the first opening 122 (illustrated in FIG. 10) and the portion of the initial core layer 131.

In one embodiment, the substrate 100 may include the preserved region D. The first graphic layer 154 may be formed over the functional layer 120 in the preserved region D. The first graphic layer 154 may be made of a photoresist. Forming the first graphic layer 154 may include a spin coating process.

In one embodiment, before forming the first graphic layer 154, a first planarization layer 153 may be formed on the sidewall spacer 141, the initial core layer 131, and the functional layer 120. The first graphic layer 154 may be formed on the first planarization layer 153. In another embodiment, the first planarization layer may not be formed.

The first planarization layer 153 may be used to flatten a bottom of the first graphic layer 154, such that reflection and scattering of light may be reduced during the formation of the first graphic layer 154, and size and position of the first graphic layer 154 may be precisely controlled.

Forming the first planarization layer 153 may include forming a first initial planarization layer in the first opening 122 and on the sidewall spacer 141, the initial core layer 131, and the functional layer 120; and performing a first planarization process on the first initial planarization layer to form the first planarization layer 153.

The first initial planarization layer may be made of an organic dielectric material. Forming the first initial planarization layer may include a spin coating process. The first planarization process may include a chemical mechanical polishing process.

Figure 13:
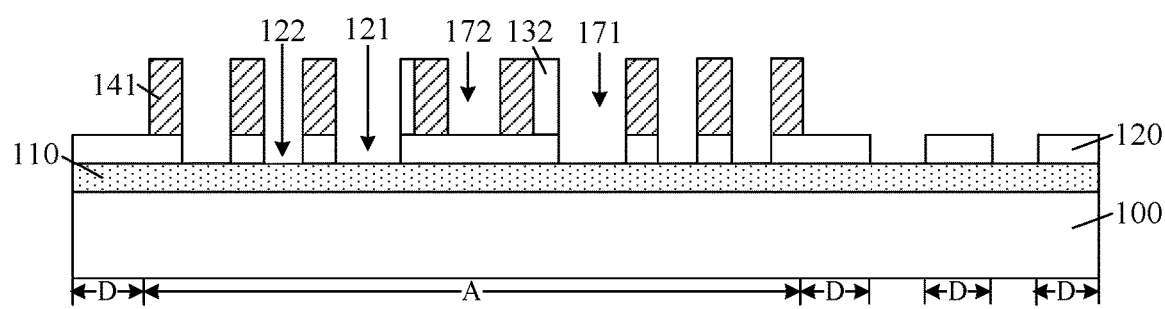
Figure 14:
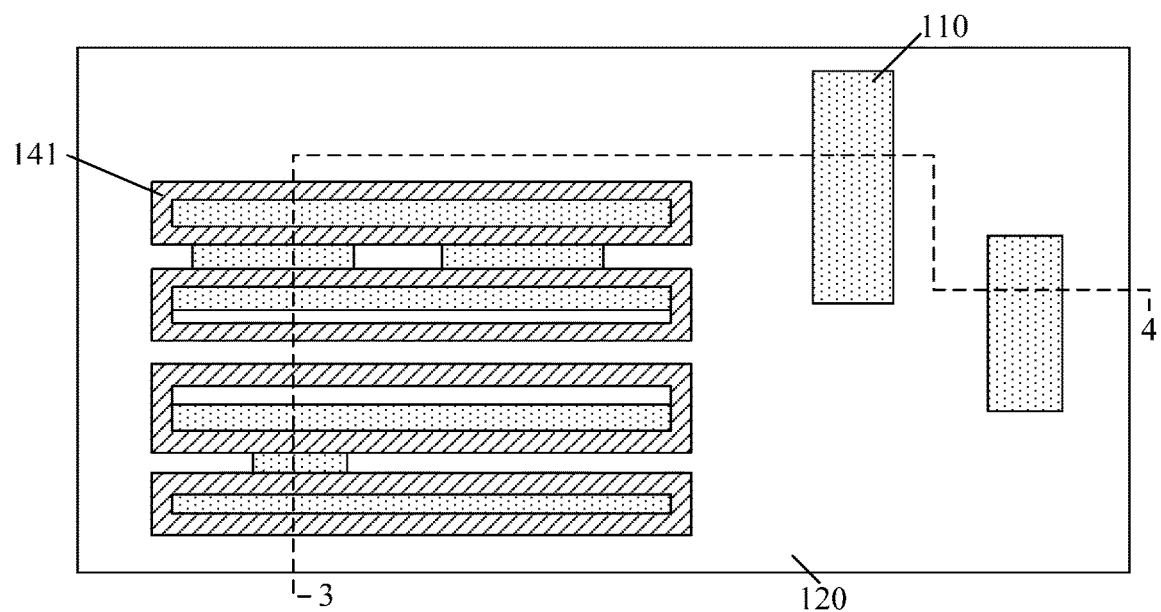

Returning to FIG. 28, after forming the first graphic layer, a second opening and a core layer may be formed (S108). FIGS. 13-14 illustrate corresponding structures. FIG. 14 illustrates a top view of the structure shown in FIG. 13, and FIG. 13 illustrates a cross-sectional view of the structure along a line '3-4' in FIG. 14.

Referring to FIGS. 13-14, a core layer 132 and a second opening 121 in the functional layer 120 may be formed by performing a second etching process on the initial core layer 131 (illustrated in FIG. 12) and the functional layer 120 using the sidewall spacer 141 and the first graphic layer 154 (illustrated in FIG. 12) as a mask.

The second etching process may be used to form the core layer 132 and the second opening 121. The second opening 121 may be used to subsequently form a second trench. The core layer 132 may protect the functional layer 120 under the core layer 132 and may prevent the functional layer 120 under the core layer 132 from being removed. Therefore, a spacing between the second opening 121 and the first opening 122 may be adjusted through a width of the core layer 132, such that the performance of the semiconductor structure may be improved.

The core layer 132 may be formed by performing a patterning process on the initial core layer 131 to remove a portion of the initial core layer 131. The second opening 121 may be disposed in the functional layer 120 at a bottom of a second gap 171 exposed by the core layer 132 and the sidewall spacer 141. Through adjusting the width of the initial core layer 131 and the width and position of the core layer 132, the spacing between the first opening 122 and the second opening 121 may be adjusted. Accordingly, the spacing between the second opening 121 and the first opening 122 may not have to be equal to the thickness of the sidewall spacer 141. Therefore, flexibility of the spacing between the second opening 121 and the first opening 122 may increase, and the performance of the formed semiconductor structure may be further improved.

The second etching process may include a dry etching process. The dry etching process may have a desired linewidth control and may easily control the width of the second opening 122, such that a width of a subsequently formed second interconnection line may be precisely controlled.

The width of the core layer 132 may be equal to the spacing between the second opening 121 and an adjacent first opening 122 minus the width of the sidewall spacer 141. That is, the width of the core layer 132 may be equal to a design-required spacing between the second interconnection line and an adjacent first interconnection line minus the width of the sidewall spacer 141.

When the design-required spacing between the second interconnection line and the adjacent first interconnection line is equal to the width of the sidewall spacer 141, the corresponding entire initial core layer 131 may be removed. When the design-required spacing between the second interconnection line and the adjacent first interconnection line is larger than the width of the sidewall spacer 141, the corresponding initial core layer 131 may be partially removed, and a portion of the initial core layer 131 may be retained to form the core layer 132. A width of the second opening 121 may be equal to the width of the initial core layer 131 minus the width of a corresponding core layer 132.

After forming the second opening 121, the first graphic layer 154 and the first planarization layer 153 (illustrated in FIG. 12) may be removed. Removing the first planarization layer 153 may include a dry etching process, or a wet etching process, etc. Removing the first graphic layer 154 may include an ashing process.

Figure 15:
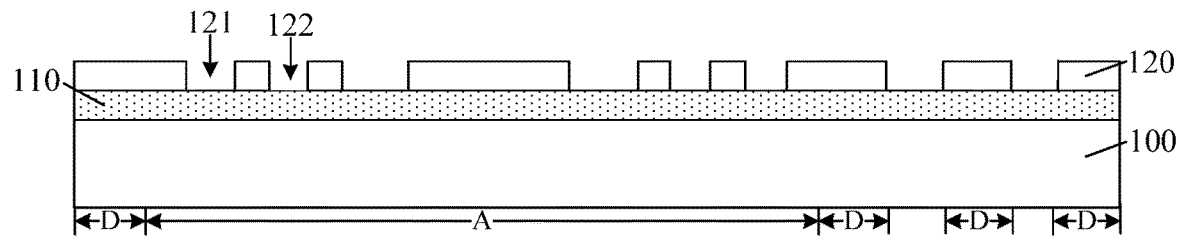

Returning to FIG. 28, after forming the second opening and the core layer, the sidewall spacer and the core layer may be removed (S109). FIG. 15 illustrates a corresponding structure.

Referring to FIG. 15, after forming the second opening 121 and the first opening 122, the sidewall spacer 141 and the core layer 132 may be removed. Removing the sidewall spacer 141 and the core layer 132 may include a dry etching process, or a wet etching process, etc.

Figure 16:
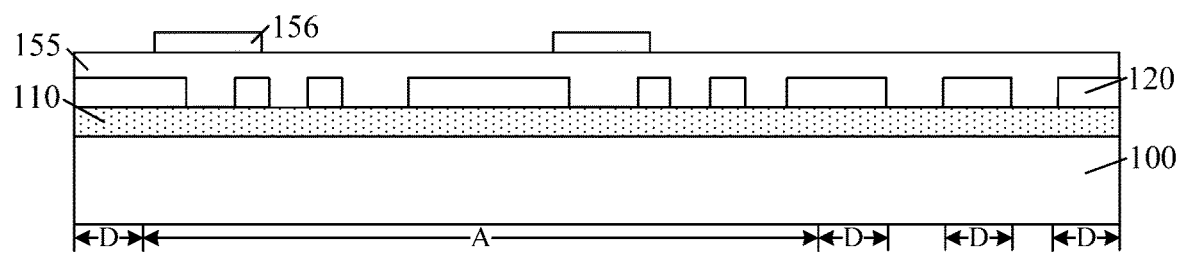

Returning to FIG. 28, after removing the sidewall spacer and the core layer, a third graphic layer may be formed (S110). FIG. 16 illustrates a corresponding structure.

Referring to FIG. 16, a patterned third graphic layer 156 may be formed over the device region A of the substrate 100. The third graphic layer 156 may partially cover the bottom of the second opening 121. The third graphic layer 156 may be made of a photoresist. Forming the third graphic layer 156 may include a spin coating process.

The third graphic layer 156 may be used as a mask for subsequently etching the device layer 110, such that a length of a subsequently formed second trench may be controlled, and a length of a subsequently formed second interconnection line may be controlled.

In one embodiment, before forming the third graphic layer 156, a third planarization layer 155 may be formed in the second opening 121 and the first opening 122, and on the functional layer 120. The third graphic layer 156 may be formed on the third planarization layer 155. In another embodiment, the third planarization layer may not be formed.

The third planarization layer 155 may be used to flatten a bottom of the third graphic layer 156, such that reflection and scattering of light may be reduced during the formation of the third graphic layer 156, and size and position of the third graphic layer 156 may be precisely controlled.

Forming the third planarization layer 155 may include forming a third initial planarization layer in the first opening 122 and the second opening 121, and on the functional layer 120; and performing a third planarization process on the third initial planarization layer to form the third planarization layer 155.

The third initial planarization layer may be made of an organic dielectric material. Forming the third initial planarization layer may include a spin coating process. The third planarization process may include a chemical mechanical polishing process.

Figure 17:
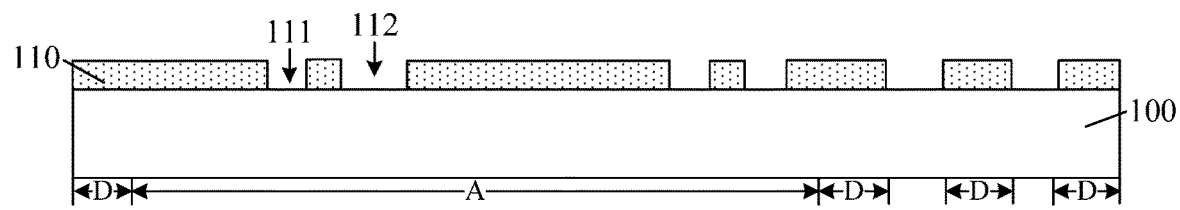
Figure 18:
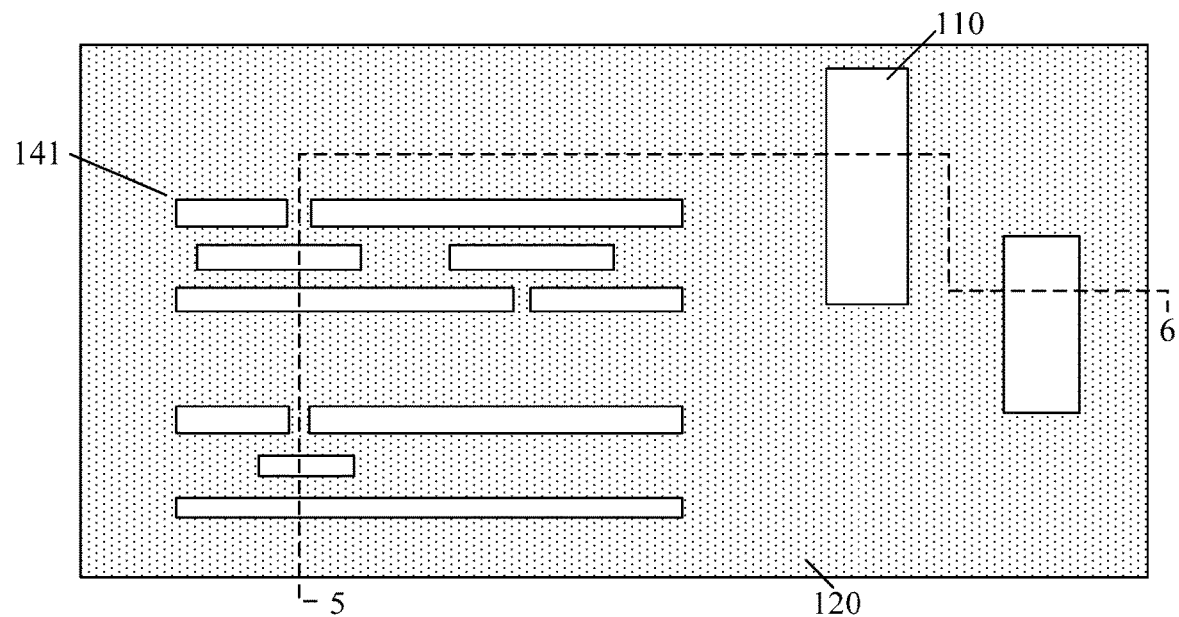

Returning to FIG. 28, after forming the third graphic layer, a second trench and a first trench may be formed (S111). FIGS. 17-18 illustrate corresponding structures. FIG. 18 illustrates a top view of the structure shown in FIG. 17, and FIG. 17 illustrates a cross-sectional view of the structure along a line '5-6' in FIG. 18.

Referring to FIGS. 17-18, by performing a trench etching process on the device layer 110 using the functional layer 120 and the third graphic layer 156 as a mask, a second trench 111 may be formed in the device layer 110 at the bottom of the second opening 121, and a first trench 112 may be formed in the device layer 110 at the bottom of the first opening 122.

The trench etching process may be used to form the second trench 111 and the first trench 112 in the device layer 110. The trench etching process may include a dry etching process. The dry etching process may have a desired linewidth control and may easily control widths of the first trench 112 and the second trench 111, such that widths of subsequently formed second interconnection line and first interconnection line may be precisely controlled.

After forming the first trench 112 and the second trench 111, the third graphic layer 156, the third planarization layer 155 and the functional layer 120 may be removed. Removing the functional layer 120 may include a dry etching process, or a wet etching process, etc. Removing the third planarization layer 155 may include a dry etching process, or a wet etching process, etc. Removing the third graphic layer 156 may include an ashing process.

In one embodiment, when a design-required length of the second interconnection line is the same as the length of the initial core layer, the third graphic layer, the third planarization layer, and the device layer may not be formed, and the first trench and the second trench may not be formed by etching the device layer.

Figure 19:
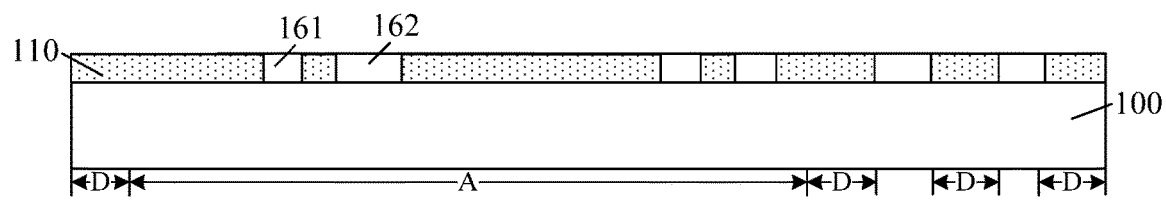

Returning to FIG. 28, after forming the second trench and the first trench, the first interconnection line and the second interconnection line may be formed (S112). FIG. 19 illustrates a corresponding structure.

Referring to FIG. 19, a first interconnection line 162 may be formed in the first trench 112, and a second interconnection line 161 may be formed in the first trench 111. In one embodiment, the first interconnection line 162 and the second interconnection line 161 may be used to electrically connect semiconductor devices in the substrate 100. In another embodiment, the first interconnection line and the second interconnection line may be used to electrically connect the semiconductor device in the substrate 100 and an external circuit.

Forming the first interconnection line 162 and the second interconnection line 161 may include: forming a metal layer in the second trench 111 and the first trench 112, and on the device layer 110; and removing the metal layer on the device layer 110 to form the first interconnection line 162 in the first trench 112 and the second interconnection line 161 in the second trench 111. In one embodiment, forming the metal layer may include an electrochemical plating process, or an electroplating process, etc. Removing the metal layer on the device layer 110 may include a chemical mechanical polishing process.

In one embodiment, the first interconnection line 162 and the second interconnection line 161 may be made of copper. In another embodiment, the first interconnection line 162 and the second interconnection line 161 may be made of aluminum.

In one embodiment, the device layer 110 is used to electrically isolate the first interconnection line 161 and the second interconnection line 162 for illustrative purposes. In another embodiment, the functional layer may be used to form a gate structure, or a dummy gate structure, etc. Accordingly, the first interconnection line and the second interconnection line may not be formed. The fabrication method may include: forming a source and drain doped region in the substrate at the bottom of the first and second trenches; and forming an isolation layer in the first and second openings, and on the substrate. The isolation layer may be made of silicon oxide. In certain embodiments, the functional layer may be used to form interconnection lines, and the functional layer may be made of aluminum.

In addition, in certain embodiments, the design-required length of the second interconnection line may be the same as the length of the initial core layer. Accordingly, the device layer may not be formed. The fabrication method may include forming interconnection lines in the first and second openings.

Figure 29:
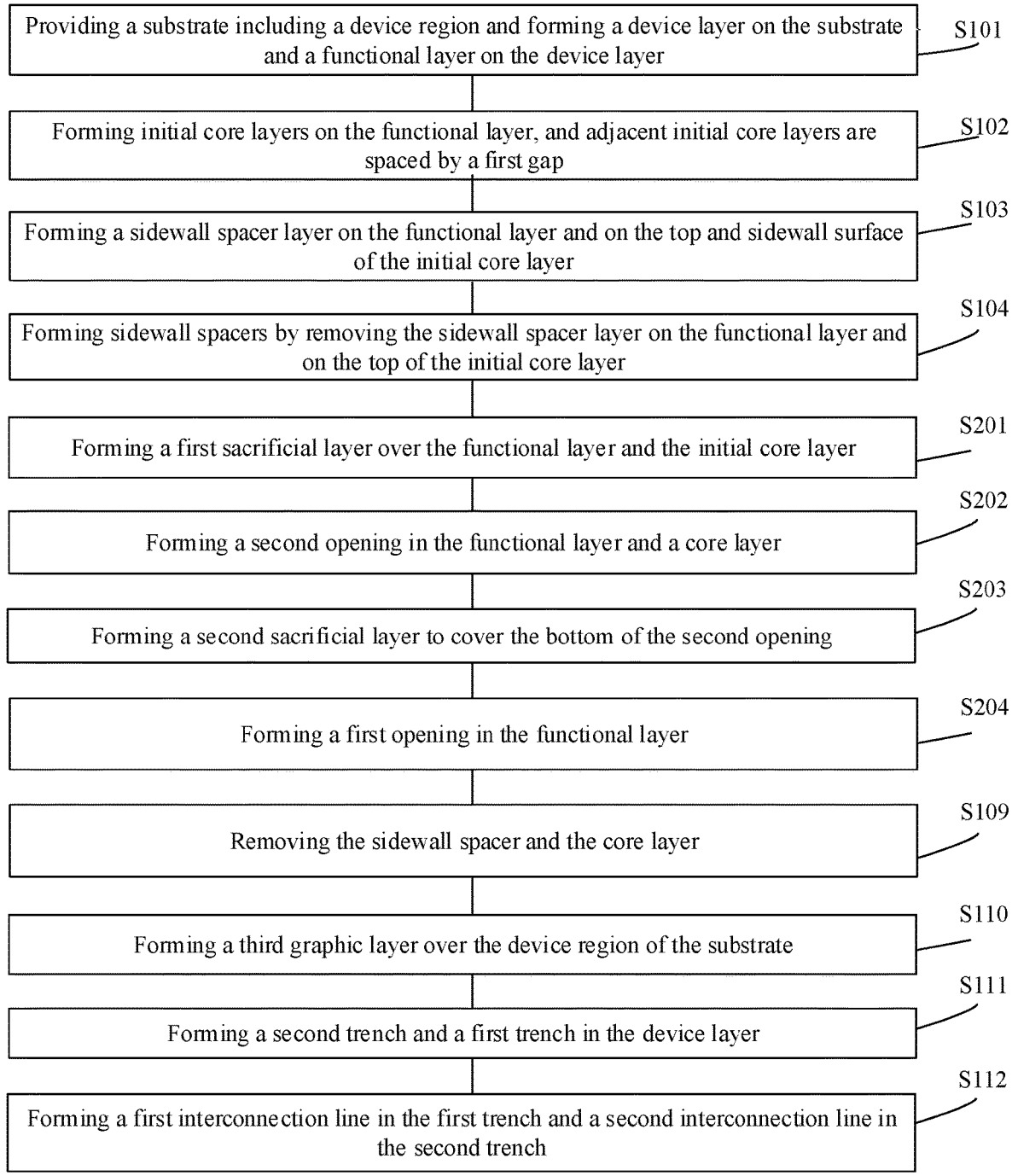
FIG. 29 illustrates another exemplary fabrication method for forming a semiconductor structure consistent with various disclosed embodiments of the present disclosure.

FIG. 29 illustrates another exemplary fabrication method for forming a semiconductor structure consistent with various disclosed embodiments of the present disclosure; and FIGS. 20-23 illustrate structures corresponding to certain stages of the exemplary fabrication method.

The same or similar features of the embodiments in the present disclosure and the embodiments associated with FIGS. 4-19 are not repeated herein, while certain difference may include the following. In the embodiments associated with FIGS. 4-19, the second opening 121 may be formed after forming the first opening 122; while in the embodiments in the present disclosure, the first opening 122 may be formed after forming the second opening 121.

A core layer may be formed by performing a patterning process on the initial core layer 131 to remove a portion of the initial core layer 131. A second opening may be formed by removing the functional layer 120 at the bottom of the second gap 171 exposed by the core layer and the sidewall spacer 141.

Figure 20:
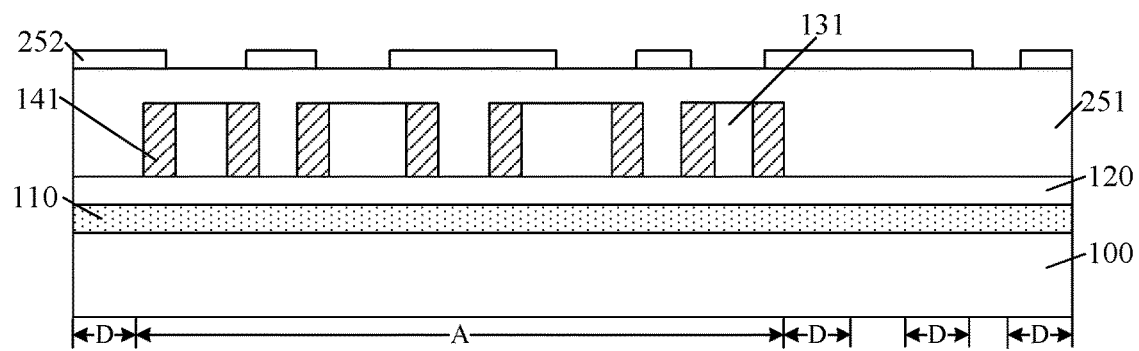
FIGS. 20-23 illustrate structures corresponding to certain stages for forming another exemplary semiconductor structure consistent with various disclosed embodiments of the present disclosure.

As shown in FIG. 29, after forming the sidewall spacer associated with FIG. 8, a first sacrificial layer may be formed (S201). FIG. 20 illustrates a corresponding structure. FIG. 20 illustrates a schematic in subsequent fabrication processes formed on the basis of FIG. 8.

Referring to FIG. 20, a patterned first sacrificial layer 252 may be formed over the functional layer 120 and the initial core layer 131. The first sacrificial layer 252 may partially expose the initial core layer 131.

To form the core layer 132, the first sacrificial layer 252 may be used as a mask for subsequently performing a third etching process on the initial core layer 131 and may protect a portion of the initial core layer 131 from being etched. The first sacrificial layer 252 may also cover the preserved region D.

Before forming the first sacrificial layer 252, a first planarization layer 251 may be formed on the functional layer 120, the sidewall spacer 141, and the initial core layer 131. In another embodiment, the first planarization layer may not be formed.

The first planarization layer 251 may be used to flatten a bottom of the first sacrificial layer 252, such that scattering of light may be reduced during the formation of the first sacrificial layer 252. The first planarization layer 251 may be made of an organic dielectric material. Forming the first planarization layer 251 may include a spin coating process.

Figure 21:
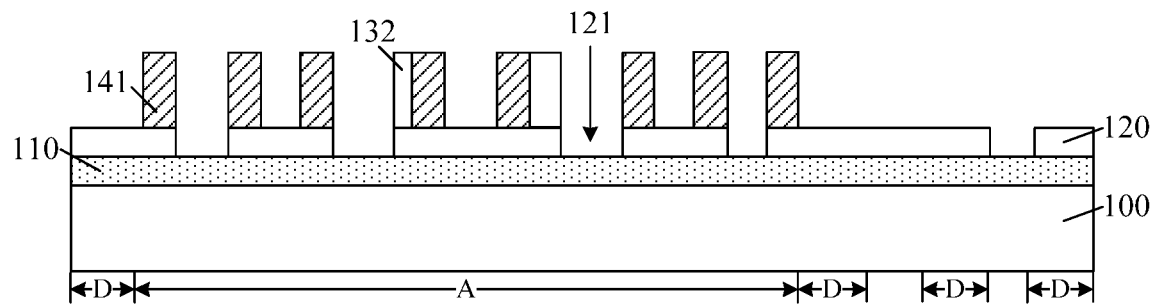

Returning to FIG. 29, after forming the first sacrificial layer, a core layer and a second opening may be formed (S202). FIG. 21 illustrates a corresponding structure.

Referring to FIG. 21, a core layer 132 and a second opening 121 in the functional layer 120 may be formed by performing a third etching process on the initial core layer 131 and the functional layer 120 using the first sacrificial layer 252 and the sidewall spacer 141 as a mask.

The third etching process may be used to form the core layer 132 and the second opening 121. After forming the second opening 121, the first sacrificial layer 252 (illustrated in FIG. 20) and the first planarization layer 251 (illustrated in FIG. 20) may be removed. Removing the first planarization layer 251 may include a dry etching process, or a wet etching process, etc. Removing the first sacrificial layer 252 may include an ashing process.

After forming the sidewall spacer 141, a first opening may be formed in the functional layer 120 by removing the functional layer 120 at the bottom of the first gap exposed by the sidewall spacer 141.

Figure 22:
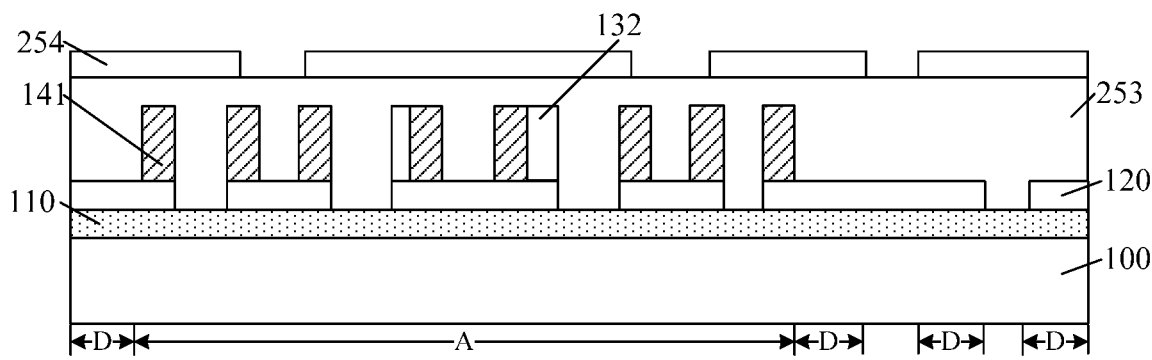

Returning to FIG. 29, after forming the second opening and the core layer, a second sacrificial layer may be formed (S203). FIG. 22 illustrates a corresponding structure.

Referring to FIG. 22, a second sacrificial layer 254 may be formed to cover the bottom of the second opening 121, and the second sacrificial layer 254 may expose the functional layer 120 at the bottom of the first gap 172. The second sacrificial layer 254 may be used as a mask of a subsequent fourth etching process and may protect the device layer 110 at the bottom of the second opening 121.

Before forming the second sacrificial layer 254, a second planarization layer 253 may be formed in the second opening 121 and on the functional layer 120, the sidewall spacer 141, and the core layer 132. The second sacrificial layer 254 may be formed on the second planarization layer 253. In another embodiment, the second planarization layer may not be formed.

The second planarization layer 253 may be used to flatten a bottom of the second sacrificial layer 254, such that scattering of light may be reduced during the formation of the second sacrificial layer 254. The second planarization layer 253 may be made of an organic dielectric material. Forming the second planarization layer 253 may include a spin coating process.

Figure 23:
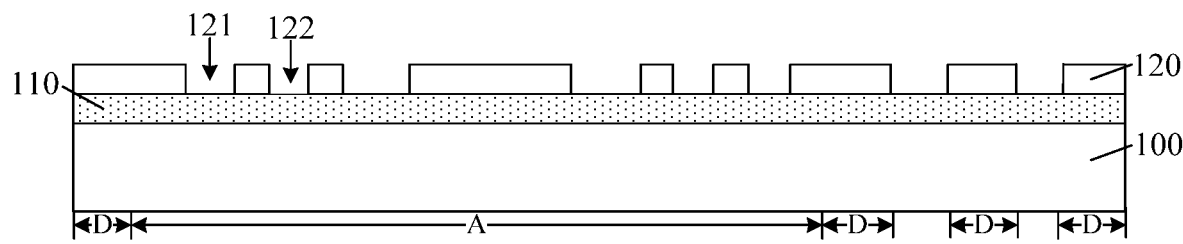

Returning to FIG. 29, after forming the second sacrificial layer, a first opening may be formed (S204). FIG. 23 illustrates a corresponding structure.

Referring to FIG. 23, a first opening 122 may be formed in the functional layer 120 by performing a fourth etching process on the functional layer 120 using the second sacrificial layer 254, the core layer 132 and the sidewall spacer 141 as a mask.

The fourth etching process may include a dry etching process. After forming the first opening 122, the second sacrificial layer 254 and the second planarization layer 253 may be removed. Removing the second planarization layer 253 may include a dry etching process, or a wet etching process, etc. Removing the second sacrificial layer 254 may include an ashing process.

In the above-described embodiments, the second opening 121 and the first opening 122 may be formed, respectively, by etching the functional layer 120 twice. Through etching the functional layer 120 twice, the width of the preserved region D may become smaller, such that the process requirements may be satisfied.

Figure 30:
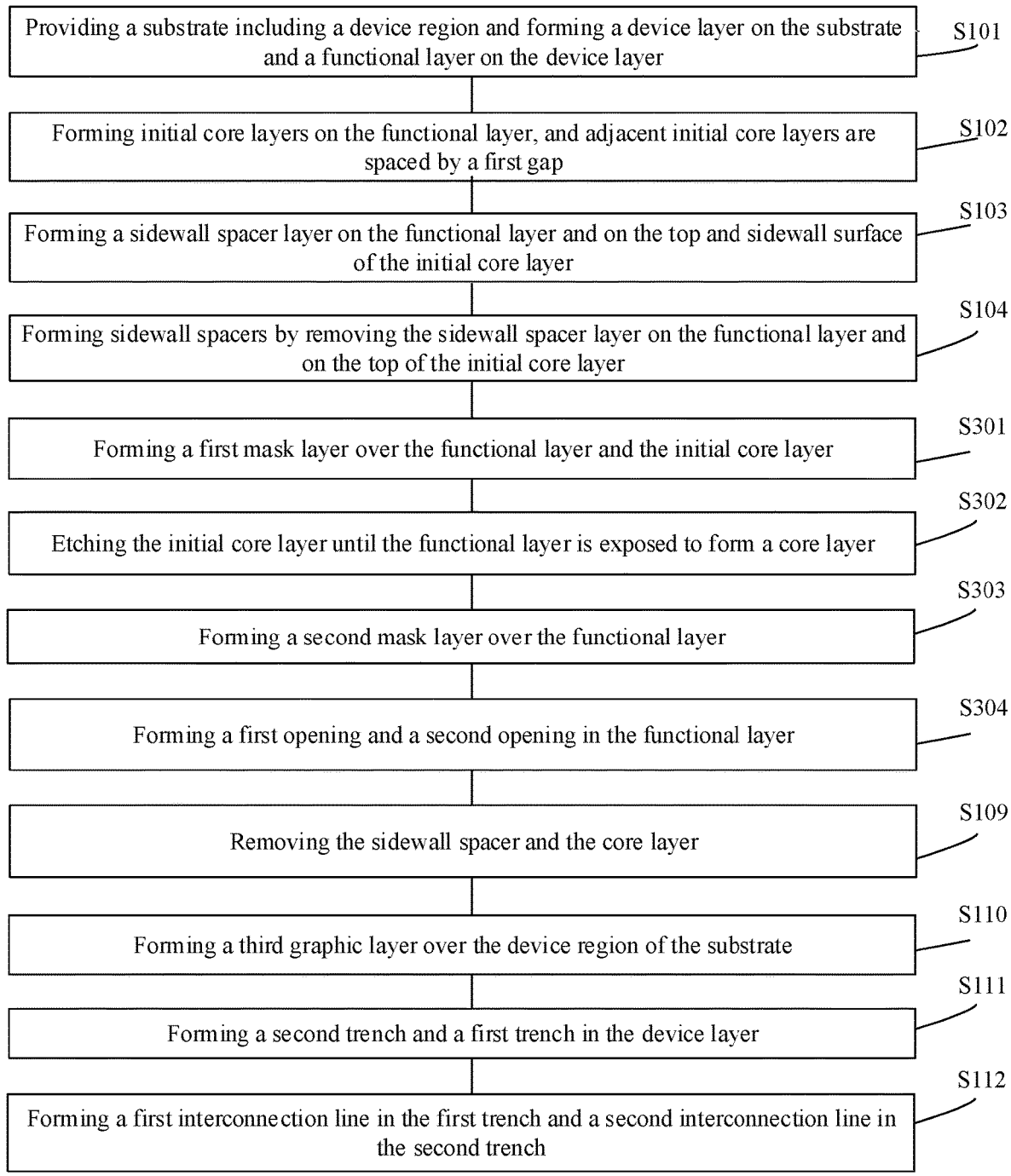
FIG. 30 illustrates another exemplary fabrication method for forming a semiconductor structure consistent with various disclosed embodiments of the present disclosure.

FIG. 30 illustrates another exemplary fabrication method for forming a semiconductor structure consistent with various disclosed embodiments of the present disclosure; and FIGS. 24-27 illustrate structures corresponding to certain stages of the exemplary fabrication method.

The same or similar features of the embodiments of the present disclosure and the embodiments associated with FIGS. 4-19 are not repeated herein, while certain difference may include the following. The core layer may be first formed by performing a patterning process on the initial core layer 131 to remove a portion of the initial core layer 131, and then, the first opening and the second opening may be formed at the same time.

Figure 24:
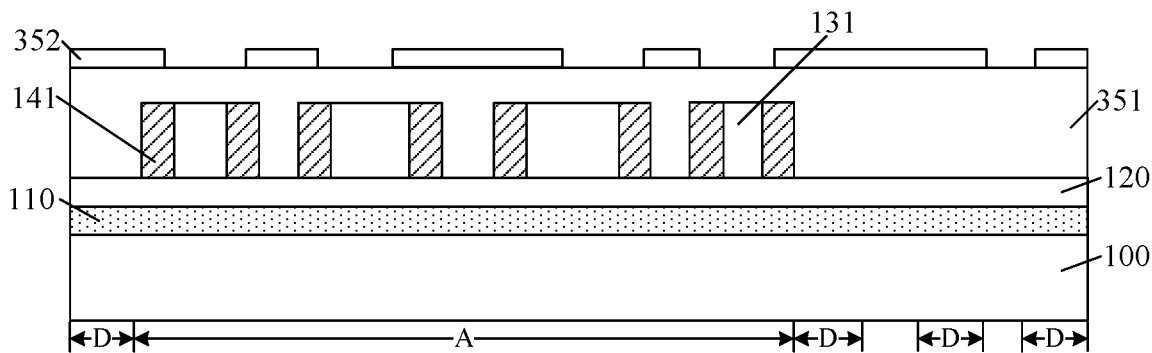
FIGS. 24-27 illustrate structures corresponding to certain stages for forming another exemplary semiconductor structure consistent with various disclosed embodiments of the present disclosure.

As shown in FIG. 30, after forming the sidewall spacer associated with FIG. 8, a patterned first mask layer may be formed (S301). FIG. 24 illustrates a corresponding structure. FIG. 24 illustrates a schematic in subsequent fabrication processes formed on the basis of FIG. 8.

Referring to FIG. 24, a patterned first mask layer 352 may be formed over the functional layer 120 and the initial core layer 131. The first mask layer 352 may partially expose the initial core layer 131.

To form the core layer 132, the first mask layer 352 may be used as a mask for subsequently etching the initial core layer 131 and may protect a portion of the initial core layer 131 from being etched. The first mask layer 352 may be made of a photoresist.

Before forming the first mask layer 352, a third planarization layer 351 may be formed on the functional layer 120, the sidewall spacer 141, and the initial core layer 131. The third planarization layer 351 may be used to flatten a bottom of the first mask layer 352, such that the effect of scattering of light on the first mask layer 352 may be reduced. Forming the third planarization layer 351 may include a spin coating process.

Figure 25:
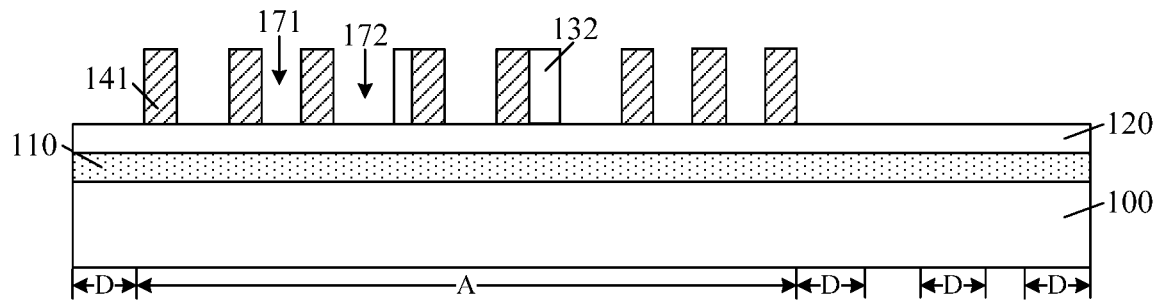

Returning to FIG. 30, after forming the first mask layer, the initial core layer may be etched (S302). FIG. 25 illustrates a corresponding structure.

Referring to FIG. 25, the initial core layer 131 may be etched using the first mask layer 352 (illustrated in FIG. 24) as a mask until the functional layer 120 is exposed, to form a core layer 132. Etching the initial core layer 131 may include a dry etching process. After etching the initial core layer 131 until the functional layer 120 is exposed, the first mask layer 352 (illustrated in FIG. 24) and the third planarization layer 351 (illustrated in FIG. 24) may be removed.

The third planarization layer 351 may be made of an organic dielectric layer. Removing the first mask layer 352 may include a dry etching process, or a wet etching process, etc. Removing the first planarization layer 351 may include an ashing process.

After forming the sidewall spacer 141, a first opening may be subsequently formed in the functional layer 120 by removing the functional layer 120 at the bottom of the first gap 172. A second opening may be subsequently formed in the functional layer 120 by removing the functional layer 120 at the bottom of the second gap 171.

In one embodiment, the substrate 100 may include the preserved region D. Before forming the second opening 121 and the first opening 122, a patterned second mask layer may be formed on the functional layer 120 in the preserved region D. The second mask layer may cover the functional layer 120 in the preserved region D and may expose the functional layer 120 at the bottom of the second gap 171 and the first gap 172.

Figure 26:
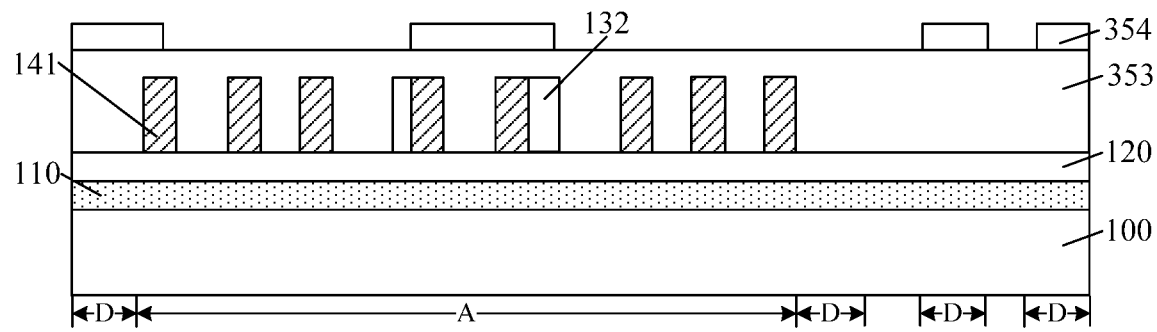

Returning to FIG. 30, after etching the initial core layer, a second mask layer may be formed (S303). FIG. 26 illustrates a corresponding structure.

Referring to FIG. 26, a patterned second mask layer 354 may be formed over the functional layer 120 in the preserved region D. The second mask layer 354 may cover the functional layer 120 in the preserved region D and may expose the functional layer 120 at the bottom of the second gap 171 and the first gap 172.

The second mask layer 354 may be used to protect the functional layer 120 in the preserved region D and may prevent the functional layer 120 in the preserved region D from being removed during a subsequent etching of the functional layer 120.

In one embodiment, the number of first gaps may be more than one, and the second mask layer 354 may partially cover the first gaps and may partially expose the functional layer 120 at the bottom of the first gaps.

The second mask layer 354 may be made of a photoresist. In one embodiment, before forming the second mask layer 354, a fourth planarization layer 353 may be formed on the functional layer 120, the sidewall spacer 141, and the core layer 132. The second mask layer 354 may be formed on the fourth planarization layer 353. In another embodiment, the fourth planarization layer may not be formed, and the second mask layer may be formed on the functional layer in the preserved region.

The fourth planarization layer 353 may be used to flatten a bottom of the second mask layer 354 during a subsequent etching of the functional layer 120, such that the effect of scattering of light on the second mask layer 354 may be reduced. The fourth planarization layer 353 may be made of an organic dielectric material. Forming the fourth planarization layer 353 may include a spin coating process.

Figure 27:
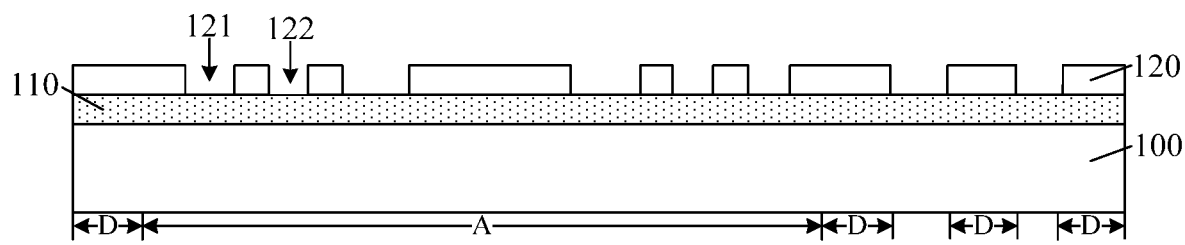

Returning to FIG. 30, after forming the second mask layer, a first opening and a second opening may be formed (S304). FIG. 27 illustrates a corresponding structure.

Referring to FIG. 27, by removing the functional layer 120 using the second mask layer 354, the sidewall spacer 141 and the core layer 132 as a mask, a first opening 122 may be formed in the functional layer 120 at the bottom of the first gap 172, and a second opening 121 may be formed in the functional layer 120 at the bottom of the second gap 171. In one embodiment, etching the functional layer 120 may include a dry etching process. The dry etching process may have desired linewidth control, such that widths of the second opening 121 and the first opening 122 may be precisely controlled.

After forming the second opening 121 and the first opening 122, the fourth planarization layer 353 and the second mask layer 354 (illustrated in FIG. 26) may be removed. Removing the fourth planarization layer 353 may include a dry etching process, or a wet etching process, etc. Removing the second mask layer 354 may include an ashing process.

In one embodiment, the substrate 100 may include the preserved region D. Before etching the functional layer 120, the second mask layer 354 may be formed on the functional layer 120. The second mask layer 354 may cover the functional layer 120 in the preserved region D. In another embodiment, the substrate may not include the preserved region. Therefore, before etching the functional layer, the second mask layer and the fourth planarization layer may not be formed.

The present disclosure also provides a semiconductor structure. FIG. 13 illustrates a cross-sectional view of an exemplary semiconductor structure consistent with various disclosed embodiments of the present disclosure. Referring to FIG. 13, the semiconductor structure may include a substrate 100 including a device region A, a functional layer 120 over the substrate 100, and a plurality of discrete sidewall spacers 140 on the functional layer 120 in the device region A. A first gap 172 and a second gap 171 may be formed between adjacent sidewall spacers 141, and the first gap 172 and the second gap 171 may be alternately arranged. The semiconductor structure may also include a core layer 132 on a sidewall surface on one side of the sidewall spacer 141. The core layer 132 may be disposed in the second gap 171. Further, the semiconductor structure may include a second opening 121 in the functional layer 120 at a bottom of the second gap 171 exposed by the sidewall spacer 141 and the core layer 132, and a first opening 122 in the functional layer 120 at a bottom of the first gap 172.

In one embodiment, the semiconductor structure may include a device layer 110 disposed between the substrate 100 and the functional layer 120. The device layer 110 may be made of a material different from the functional layer 120. In another embodiment, the semiconductor structure may not include the device layer.

The functional layer 120 may be made of silicon oxynitride, silicon nitride, or an organic dielectric material, etc. The organic dielectric material may include polyimide. In one embodiment, the functional layer 120 may be made of silicon nitride.

The device layer 110 may be made of an insulating material, such as silicon oxynitride, silicon nitride, or an organic dielectric material, etc. The organic dielectric material may include polyimide. In one embodiment, the device layer 110 may be made of silicon oxide.

In another embodiment, the semiconductor structure may not include the device layer. The semiconductor structure may include interconnection lines in the second and first openings. The interconnection line may be made of copper.

In certain embodiments, the functional layer may be made of aluminum, polysilicon, polycrystalline germanium, or polycrystalline silicon germanium, etc. The semiconductor structure may include an isolation layer disposed in the second and first openings. The isolation layer may be made of silicon oxide, silicon nitride, silicon oxynitride, or an organic dielectric material. The organic dielectric material may include polyimide.

Accordingly, in the disclosed method for fabricating the semiconductor structure, the core layer may be formed by performing a patterning process on the initial core layer to remove a portion of the initial core layer. The second opening may be formed in the functional layer at the bottom of the second gap exposed by the core layer and the sidewall spacer. Through adjusting the width of the initial core layer and the width and position of the core layer, the spacing between the first opening and the second opening may be adjusted, such that the spacing between the second opening and the first opening may be an arbitrary value. Therefore, the flexibility of the spacing between the second opening and the first opening may increase, and the performance of the formed semiconductor structure may be further improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a substrate, wherein the substrate includes a device region;
    forming a functional layer on the substrate;
    forming a plurality of discrete initial core layers on the functional layer, wherein adjacent initial core layers are spaced apart by a first gap;
    forming a sidewall spacer on a sidewall surface of an initial core layer;
    forming a first opening in the functional layer by removing the functional layer at a bottom of the first gap;
    forming a core layer and a second gap between sidewall spacers by performing a patterning process on the initial core layer to remove a portion of the initial core layer; and
    forming a second opening in the functional layer by removing the functional layer exposed at a bottom of the second gap.

2. The method according to claim 1, wherein:
the second opening is formed after forming the first opening,
wherein:
    forming the first opening includes:
        forming the first opening in the functional layer by performing a first etching process on the functional layer using the sidewall spacer and the initial core layer as a mask, and
    the patterning process and forming the second opening include:
        forming a patterned first graphic layer at the bottom of the first gap and on the initial core layer, wherein the first graphic layer exposes a portion of the initial core layer, and
        using the first graphic layer and the sidewall spacer as a mask, forming the core layer and the second opening in the functional layer by performing a second etching process on the initial core layer and on the functional layer, respectively.

3. The method according to claim 2, wherein before forming the first graphic layer, further including:
    forming a first planarization layer in the first opening and on the sidewall spacer, on the initial core layer and on the functional layer; and
    forming the first graphic layer on the first planarization layer.

4. The method according to claim 2, wherein:
the substrate includes a preserved region, wherein:
    before performing the first etching process, a patterned second graphic layer is formed on the functional layer and covers the functional layer in the preserved region, wherein the second graphic layer is used as a mask of the first etching process, and
    the first graphic layer covers the functional layer in the preserved region.

5. The method according to claim 4, before forming the second graphic layer, further including:
    forming a second planarization layer on the functional layer, on the sidewall spacer, and on the initial core layer; and
    forming the second graphic layer on the second planarization layer.

6. The method according to claim 4, wherein:
the first graphic layer is made of a photoresist; and
the second graphic layer is made of a photoresist.

7. The method according to claim 1, wherein:
the first opening is formed after forming the second opening,
wherein:
    the patterning process and forming the second opening include:
        forming a patterned first sacrificial layer on the functional layer and on the initial core layer, wherein the first sacrificial layer exposes a portion of the initial core layer, and
        using the first sacrificial layer and the sidewall spacer as a mask, forming the core layer and the second opening in the functional layer by performing a third etching process on the initial core layer and on the functional layer, respectively, and forming the first opening includes:
forming a patterned second sacrificial layer at a bottom of the second opening and on the functional layer, wherein the second sacrificial layer exposes the functional layer at the bottom of the first gap, and forming the first opening in the functional layer by performing a fourth etching process on the functional layer using the second sacrificial layer, the core layer, and the sidewall spacer as a mask.

8. The method according to claim 7, wherein:
the substrate includes a preserved region;
the first sacrificial layer covers the functional layer in the preserved region; and
the second sacrificial layer covers the functional layer in the preserved region.

9. The method according to claim 1, wherein the patterning process includes:
forming a patterned first mask layer on the initial core layer, wherein the first mask layer exposes a portion of the initial core layer; and
etching the initial core layer using the first mask layer as a mask until the functional layer is exposed.

10. The method according to claim 9, wherein forming the first opening and the second opening includes:
etching the functional layer using the core layer and sidewall spacer as a mask to form the first opening in the functional layer at the bottom of the first gap, and to form the second opening in the functional layer at the bottom of the second gap.

11. The method according to claim 10, wherein:
the substrate includes a preserved region; and
a patterned second mask layer is formed on the functional layer in the preserved region before etching the functional layer, wherein the second mask layer exposes the functional layer at the bottom of the first and second gaps.

12. The method according to claim 4, wherein:
the number of the first gaps is more than one, wherein:
the first opening is formed in the functional layer by partially removing the functional layer at the bottom of the first gaps, and
the second graphic layer partially covers the functional layer at the bottom of the first gaps.

13. The method according to claim 1, wherein forming the initial core layers includes:
forming an initial core film on the functional layer; and
forming the initial core layers on the functional layer by performing an initial patterning process on the initial core film.

14. The method according to claim 1, further including:
before forming the functional layer, forming a device layer on the substrate, wherein the device layer is made of a material different from the functional layer;
after forming the first opening and the second opening, forming a third graphic layer to partially cover a bottom of the second opening;
forming a second trench in the device layer at the bottom of the second opening, and a first trench in the device layer at a bottom of the first opening by performing a trench etching process on the device layer using the third graphic layer and the functional layer as a mask; and
removing the functional layer after forming the second trench and the first trench.

15. The method according to claim 14, wherein:
the device layer is made of one or more of polysilicon, polycrystalline germanium, and polycrystalline silicon germanium; and
the functional layer is made of one or more of silicon oxide, silicon oxynitride, and silicon nitride.

16. The method according to claim 14, wherein:
the device layer is made of one or more of silicon oxide, silicon nitride, silicon oxynitride, and an organic dielectric material;
a second interconnection line is formed in the second trench; and
a first interconnection line is formed in the first trench.

17. The method according to claim 1, wherein:
the functional layer is made of one or more of silicon oxide, silicon nitride, silicon oxynitride, and an organic dielectric material;
a second interconnection line is formed in the second opening; and
a first interconnection line is formed in the first opening.

18. The method according to claim 1, after forming the second opening and the first opening, further including:
removing the core layer and the sidewall spacer.

* * * * *